US012625191B2

(12) United States Patent
Hofer et al.

(10) Patent No.: US 12,625,191 B2
(45) Date of Patent: May 12, 2026

(54) DC LINK CAPACITOR CHARGING AND GENERATING EXCITATION CURRENTS FOR BATTERY CELL MONITORING

(71) Applicant: Infineon Technologies AG, Neubiberg (DE)

(72) Inventors: Guenter Hofer, St. Oswald (AT); Guenter Schwarzberger, Reitmehring (DE)

(73) Assignee: Infineon Technologies AG, Neubiberg (DE)

( * ) Notice: Subject to any disclaimer, the term of this patent is extended or adjusted under 35 U.S.C. 154(b) by 114 days.

(21) Appl. No.: 18/631,691

(22) Filed: Apr. 10, 2024

(65) Prior Publication Data

US 2025/0321284 A1      Oct. 16, 2025

(51) Int. Cl.
*G01R 31/385*      (2019.01)
*G01R 31/389*      (2019.01)
*G01R 31/396*      (2019.01)

(52) U.S. Cl.
CPC ......... *G01R 31/385* (2019.01); *G01R 31/389* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 2007/0252601 A1 | 11/2007 | Satoh et al. | |
| 2012/0303208 A1* | 11/2012 | Hariharan | H01M 10/48 701/32.9 |
| 2017/0373615 A1* | 12/2017 | Lewis | H02P 6/08 |
| 2020/0256924 A1* | 8/2020 | Hoermaier | G01R 31/389 |
| 2021/0111649 A1* | 4/2021 | Shook | H02J 7/0063 |
| 2021/0218253 A1* | 7/2021 | Kim | H01M 50/20 |

FOREIGN PATENT DOCUMENTS

| | | |
|---|---|---|
| WO | 2019193262 A1 | 10/2019 |
| WO | 2021140283 A1 | 7/2021 |
| WO | 2022084595 A1 | 4/2022 |
| WO | 2022171936 A1 | 8/2022 |

* cited by examiner

*Primary Examiner* — Nasima Monsur
(74) *Attorney, Agent, or Firm* — Shumaker & Sieffert, P.A.

(57) ABSTRACT

A driver circuit is configured to control an ON/OFF state of a semiconductor power switch circuit, wherein the semiconductor power switch circuit is configured to connect a plurality of battery cells to a DC link capacitor associated with an electric motor. The driver circuit is configured to: control the semiconductor power switch circuit to cause the plurality of battery cells to charge the DC link capacitor; and control the semiconductor power switch circuit to generate and deliver an excitation current from the plurality of battery cells, wherein the excitation current is defined for a complex battery impedance measurement operation. The DC link capacitor is positioned in parallel with the electric motor. The excitation current comprises a periodic signal that passes from the semiconductor power switch circuit, through the DC link capacitor, and back to the plurality of battery cells.

21 Claims, 7 Drawing Sheets

16

14

Battery Disconect Switch (BDS)

E.g., CoolSiC™ 1200 V SiC Trench MOSFET

E.g.,
400V
~100 cells

Dc Link Cap

10

E.g.,~500uF

M

12

100

DC LINK CAPACITOR CHARGING AND GENERATING EXCITATION CURRENTS FOR BATTERY CELL MONITORING

TECHNICAL FIELD

This disclosure relates to battery powered devices, such as electric vehicles, power switches and driver circuits for the power switches, and systems and circuits configured to perform battery cell monitoring functions for a plurality of battery cells.

BACKGROUND

Battery powered devices, such as electric vehicles, often include many battery cells connected in series to form a battery system for the battery powered device. For such battery systems, battery management systems (BMSs) are often used for battery cell monitoring, thermal monitoring, cell balancing of different battery cells or different sets of battery cells, or other battery management functions. The battery cells in the BMS are configured to provide power, e.g., to an electric motor of an electric vehicle.

BMSs often use several different battery monitoring circuits (e.g., cell sense circuits "CSCs") in order to monitor the individual battery cells of a battery powered device. For example, in BMS systems, battery cell impedance measurements are desirable. The so-called "complex impedance" of battery cells, however, can be more difficult to obtain than simple resistance measurements. Battery cell impedance can be affected by many factors, such as the battery cell structure, operational temperature changes, aging, state of charge, atmospheric pressure, environmental exposure, or other factors.

It is desirable to utilize a so-called DC link capacitor in the connection of the battery cells to the electric motor. The DC link capacitor may be positioned in parallel to the electric motor. Power delivery form the battery cells to the electric motor can be improved by delivering a pre-charge on the DC-link capacitor prior to connecting the battery cells to the electric motor. The DC-link capacitor can provide several benefits to the system.

SUMMARY

In general, this disclosure is directed to techniques and driver circuits for controlling a power switch for both the charging of a DC link capacitor and for generating excitation currents for impedance monitoring of battery cells. According to this disclosure, a battery disconnect switch (BDS) may be used as a safety mechanism, e.g., providing the ability to disconnect an electric motor from the battery supply. In addition, the BDS can also be used as a charging mechanism, e.g., used for charging a DC link capacitor associated with the electric motor. Moreover, the current profile used in DC link capacitor charging can be defined in a way to allow that same current to be also used as an excitation current for battery cells, e.g., to facilitate complex impedance measurements on the battery cells. The driver circuits described herein can be used to control the BDS for both the charging of a DC link capacitor and for generating excitation currents for impedance monitoring of battery cells. Several advantages associated with the circuits and techniques of this disclosure are explained in greater detail below.

In some examples, this disclosure describes a driver circuit configured to control an ON/OFF state of a semiconductor power switch circuit, wherein the semiconductor power switch circuit is configured to connect a plurality of battery cells to a DC link capacitor associated with an electric motor. The driver circuit may be configured to: control the semiconductor power switch circuit to cause the plurality of battery cells to charge the DC link capacitor and control the semiconductor power switch circuit to generate and deliver an excitation current from the plurality of battery cells, wherein the excitation current is defined for a complex battery impedance measurement operation.

In some examples, this disclosure a method that comprises controlling a semiconductor power switch circuit to connect a plurality of battery cells to a DC link capacitor associated with an electric motor. Moreover, according to this disclosure, controlling the semiconductor power switch circuit may include controlling the semiconductor power switch circuit to cause the plurality of battery cells to charge the DC link capacitor and controlling the semiconductor power switch circuit to generate and deliver an excitation current from the plurality of battery cells to the plurality of battery cells, wherein the excitation current is defined for a complex battery impedance measurement operation.

In some examples, this disclosure describes a system that comprises a semiconductor power switch circuit and a driver circuit. The semiconductor power switch circuit may be configured to connect a plurality of battery cells to a DC link capacitor associated with an electric motor. The driver circuit may be configured to control the ON/OFF state of the semiconductor power switch circuit, wherein the driver circuit is configured to: control the semiconductor power switch circuit to cause the plurality of battery cells to charge the DC link capacitor, and control the semiconductor power switch circuit to generate and deliver an excitation current from the plurality of battery cells to the plurality of battery cells, wherein the excitation current is defined for a complex battery impedance measurement operation. The system may further include additional elements, such as the plurality of battery cells, the electric motor, and the DC link capacitor associated with the electric motor and arranged in parallel with the electric motor.

Details of these and other examples are set forth in the accompanying drawings and the description below. Other features, objects, and advantages will be apparent from the description and drawings, and from the claims.

DETAILED DESCRIPTION

This disclosure is directed to techniques and driver circuits for controlling a power switch for both the charging of a DC link capacitor and for generating excitation currents for impedance monitoring of battery cells. According to this disclosure, a battery disconnect switch (BDS) may be used a safety mechanism, e.g., providing the ability to disconnect an electric motor from the battery supply. In addition, the BDS can also be used as a charging mechanism, e.g., used for charging a DC link capacitor associated with the electric motor. Moreover, the current profile used in DC link capacitor charging can be defined in a way that allows that same current to be also used as an excitation current for battery cells, e.g., to facilitate complex impedance measurements on the battery cells. The driver circuits described herein can be used to control the BDS for both the charging of a DC link capacitor and for generating excitation currents for impedance monitoring of battery cells.

In some examples, this disclosure proposes a semiconductor power switch to be used as the BDS in an electrical system, such as an electric vehicle. In this case, the BDS may replace a conventional relay circuit, and may provide more responsiveness and control relative a conventional relay circuit. The semiconductor power switch as the BDS also allows the BDS to be used as a pre-charging circuit, e.g., for pre-charging a DC link capacitor, which may occur at vehicle start-up.

Battery cell monitoring techniques may include complex impedance measurements on battery cells, which is typically performed by battery monitoring circuits, e.g., so-called cell sense circuits (CSCs). The complex impedance measurements may utilize an excitation current, which is typically generated by an external circuit, e.g., a dedicated circuit for generating the excitation current or another existing circuit in the system to generate the excitation current. By using a semiconductor BDS for generating the excitation current, according to this disclosure, the need for a dedicated circuit for this purpose may be eliminated, thereby reducing the number of circuits in the system. Moreover, other systems or circuits for generating the excitation current may be very inefficient insofar as they may be designed for other primary purposes such as for controlling other smaller motors (e.g., seat control motors) of the vehicle. According to this disclosure, using a semiconductor BDS for generating the excitation current can achieve more efficiencies relative to using other existing circuits in the system. DC link capacitor charging and excitation current generation may be performed simultaneously by creating a current profile for DC capacitor charging that is also configured as an excitation current (e.g., a periodic signal with a sufficient number of periods defined for complex impedance measurements).

Figure 1:
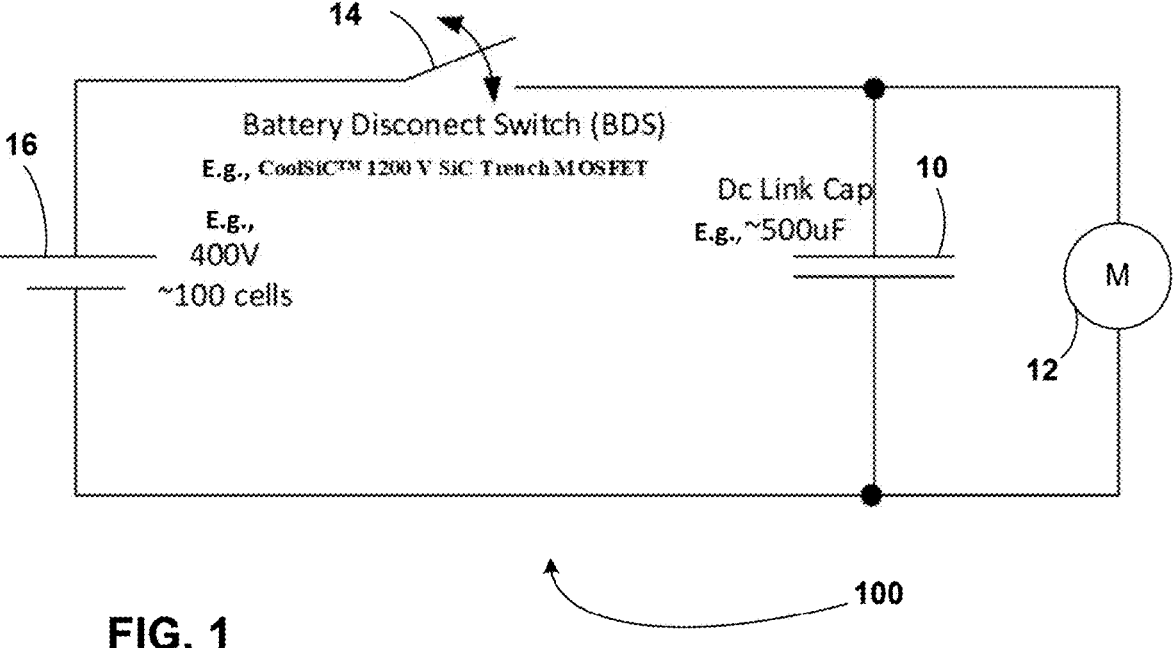
FIG. 1 is system diagram showing an example system for charging a DC link capacitor associated with an electric motor, the system including a semiconductor switch configured as both a BDS for the system and as a power switch for controlling the charging of the DC link capacitor.

FIG. 1 is system diagram showing an example system 100 for charging a DC link capacitor 10 associated with an electric motor 12. The system of FIG. 1 includes a semiconductor switch 14 configured as both a battery disconnect switch (BDS) for system 100 and as a power switch for controlling the charging of DC link capacitor 10. The example values illustrated in FIG. 1 are merely exemplary of one example vehicle system. Battery 16 represents a 400V battery stack with a plurality of battery cells, e.g., 100 cells. However, different numbers of battery cells and different voltages may be used. Indeed, some electric vehicle motors currently in development are configured for an 800V battery stack. As an example related to a 400V battery stack, one cell may define characteristics: <1 m$\Omega$ and ~50 nH to 100 nH. 100 Cells may define characteristics: <100 m$\Omega$ and ~5 uH to 10 uH.

In FIG. 1, electric motor 12 may generally represent the electric motor of a vehicle and the associated inverter circuit that converts DC signals to AC signals to drive the motor. DC link capacitor 10 is positioned in parallel with electric motor 12. DC link capacitor 10 may provide several advantages in system 100. For example, DC link capacitor 10 can help to compensate for power pulsation on the AC side and may buffer energy exchange between the AC and DC sides. In addition, DC link capacitor 10 may help to stabilize the DC-side voltage and suppress voltage harmonics. Moreover, DC link capacitor 10 may help to absorb current ripples, which may exist on a connected DC bus. DC link capacitor 10 may also help provide transient power peaks to the load, and may absorb demagnetization energy of motor 12 in the case of an emergency shutdown.

BDS 14 may comprise a semiconductor power switch. As one non-limiting example, BDS 14 may be realized with a CoolSiC™ 1200V Silicon Carbide (SiC) Trench metal oxide semiconductor field effect transistor (MOSFET) commercially available from Infineon Technologies AG, Germany. However, other semiconductor switches may also be used. A semiconductor switch is desirable relative to a relay circuit as a disconnect mechanism because of the fast-switching speed associated with the semiconductor switch, providing faster response and also facilitating the other functions described herein, such as DC capacitor charging and generating excitation current. One primary function of BDS 14 is to operate as a safety disconnect between electric motor 12 and battery 16. A system-level controller, or one or more dedicated circuits may be connected to BDS 14 and may cause BDS 14 to open so as to disconnect the system, in response to a problem or issue within system 100. In this way, BDS 14 may operate as a primary disconnect safety feature of system 100.

According to this disclosure, BDS 14 can also be controlled in a way that achieves other desirable results. In particular, BDS 14 can be controlled to facilitate both the pre-charging of DC link capacitor 10 and generating excitation current for complex impedance measurements on the individual cells of battery 16. Pre-charging of DC link capacitor 10 may occur at motor start-up, and this instance of time can also be used to perform the complex impedance measurements on the individual cells of battery 16.

A driver circuit (not shown in FIG. 1) may be configured to control an ON/OFF state of BDS 14 so as to perform the various functions described herein, including the pre-charging of DC link capacitor 10 and generating excitation current for complex impedance measurements on the individual cells of battery 16. The same driver circuit, another driver circuit, or another dedicated control circuit may be configured to also control BDS 14 to perform battery disconnect functions, when necessary, in system 100.

According to this disclosure, the driver circuit that controls BDS 14 may be configured to perform a method of controlling BDS 14 to connect a plurality of battery cells of battery 16 to DC link capacitor 10 associated with electric motor 12. BDS 14 is one example of a semiconductor power switch circuit. Controlling BDS 14 may include controlling BDS 14 to cause the plurality of battery cells of battery 16 to charge DC link capacitor 10 and controlling BDS 14 to also generate and deliver an excitation current from the plurality of battery cells to the plurality of battery cells, wherein the excitation current is defined for a complex battery impedance measurement operation.

In steady state operation, the driver circuit that controls BDS 14 may control BDS 14 to connect the plurality of battery cells associated with battery 16 to electric motor 12 in the presence of a charged DC link capacitor 10 such that the plurality of battery cells deliver power to electric motor 12.

A vehicle that includes system 100 may be configured to perform a start-up routine, when the vehicle is started, and to perform a shut-down routine when the vehicle is shut down. The start-up routine may include controlling BDS 14 to cause the plurality of battery cells of battery 16 to charge DC link capacitor 10, and controlling BDS 14 to generate and deliver the excitation current from the plurality of battery cells of battery 16 back to the plurality of battery cells of battery 16. For example, the current delivered to DC link capacitor 10 through BDS 14 may define a high-frequency periodic signal (alternating signal), and alternating nature of the signal can allow the signal to pass through DC link capacitor 10 and back to battery 16 as an excitation signal for the battery cells of battery 16. The shut down routine, e.g., performed at vehicle shut off, may include discharging DC link capacitor 10 via another discharge circuit (not shown in FIG. 1). Discharging DC link capacitor 10 at shut down may be desirable to promote safety. The start-up routine may be performed at each start-up of the electric vehicle and the shut-down routine is performed at each shut-down of the electric vehicle.

The excitation current may be created by controlling BDS 14 in a specific manner so as to create the excitation current defined for the complex impedance measurement operation by one or more CSCs (not shown in FIG. 1). For example, the excitation current may comprise a periodic signal that includes at least 3 periods, e.g., in some examples between 5 and 10 periods inclusive. The driver circuit that controls BDS 14 may control the ON/OFF state of the semiconductor power switch circuit according to pulse modulation (PM) signals, e.g., pulse width modulation (PWM) signals or other modulation control signals used for controlling a power transistor. Current delivered from battery 16 through BDS 14 may simultaneously charge DC link capacitor 10, and define the excitation current delivered to from the plurality of battery cells associated with battery 16 back to the plurality of battery cells.

Figure 2:
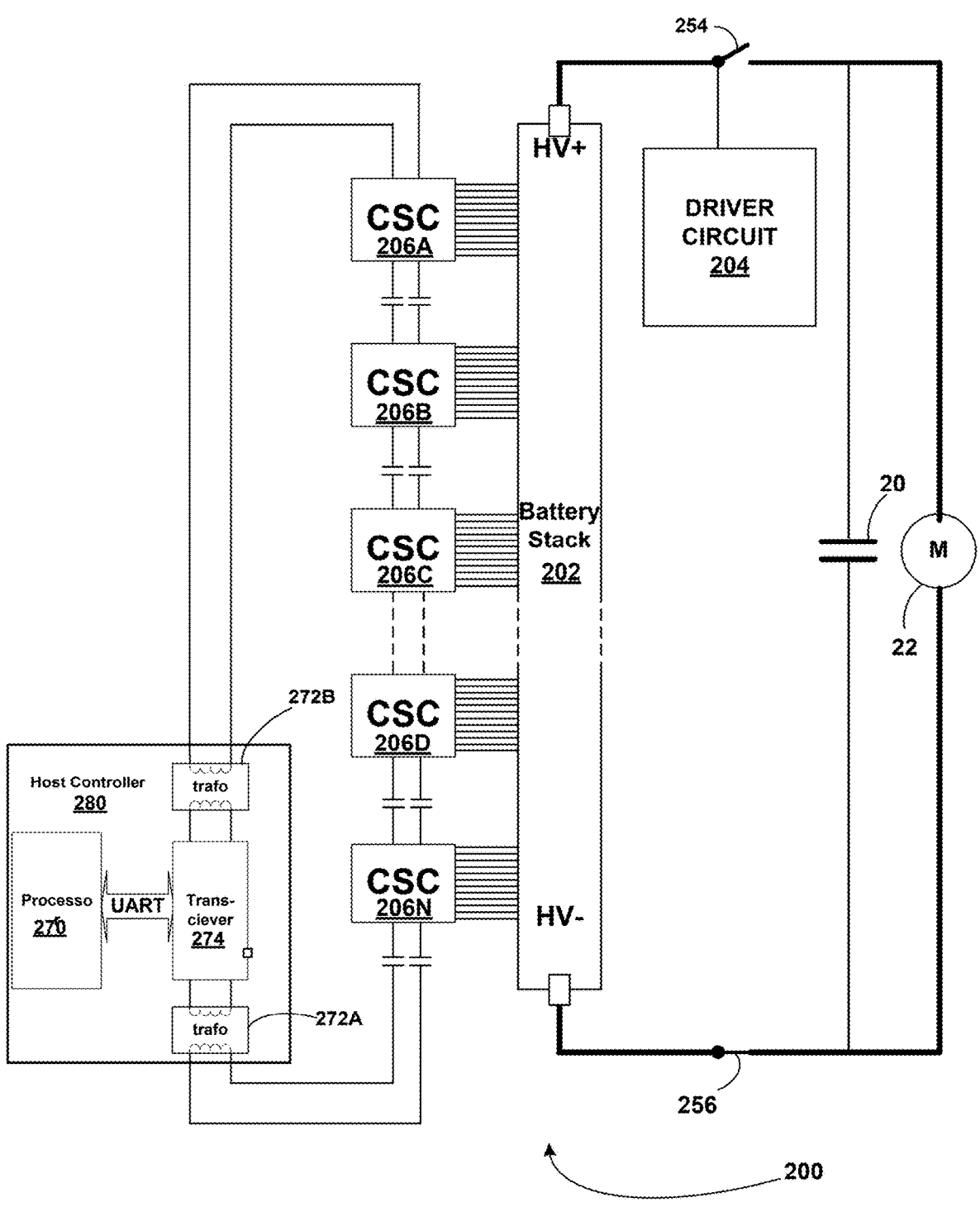
FIG. 2 is a simplified diagram of another example system consistent with this disclosure.

FIG. 2 is a system diagram of another system 200 consistent with this disclosure. In some examples consistent with FIG. 1, in system 200, battery stack 202 may correspond to battery 16, semiconductor power switch circuit 254 may correspond to BDS 14, DC link capacitor 20 may correspond to DC link capacitor 10, and electric motor 22 may correspond to electric motor 12.

System 200 may comprise a plurality of battery management circuits, e.g., CSC 206A, CSC 206B, CSC 206C, CSC 206D, CSC 206N (collectively "CSCs 206). Any number N of CSCs may be used to monitor any number of battery cells. For electric vehicles, each CSC typically monitors a subset of the battery cells, e.g., 12 cells or 16 cells per CSC.

CSCs 206 maybe controlled by a host controller 280. In the illustrated example of FIG. 2, host controller 280 communicates with the CSCs 206 according to a daisy chain protocol. In particular, the communication connections among CSCs 206 may connect each of the N CSCs 206 in a daisy chain to host controller 380. The daisy chain may comprise a ring network that includes the CSCs 206 and host controller 280, e.g., communicating according to an international standards organization (ISO) universal asynchronous receiver-transmitter (UART) protocol. Host controller 280 may include a transceiver 274 that is part of the ring network and host controller 280 may also include a processor 270 connected to transceiver 374, wherein processor 370 is configured to control the CSCs 206. Host controller 280 may also include transformer coils 272A, 272B the sending and receiving sides of host controller 280 to maintain galvanic isolation between host controller 380 and battery domain of CSCs 206.

Processor 770 may be configured to communicate via transceiver 274 according to a UART protocol, e.g., to facilitate communication with CSCs 206 over the ring network using a daisy chain approach. In some examples, processor 270 and transceiver 274 may be configured to communicate "enable" signals, e.g., to wake up one or more CSCs 206 when needed for battery monitoring functions, such as complex impedance measurements. Other types of communication and control techniques or circuits could also be used to control CSCs 206.

CSCs 206 may be configured to perform complex impedance measurements on the individual battery cells within battery stack 202. In order to facility such complex impedance measurements by CSCs 206, an excitation current is typically needed. The excitation current is conventionally generated by a dedicated circuit designed specifically for that purpose or by another motor control circuit of the system (e.g., an automatic seat motor control circuit). A dedicated circuit to generate excitation current adds undesirable complexity to the system, whereas using another motor control circuit for generating the excitation current can be very inefficient.

According to this disclosure, driver circuit 204 may be configured to control a semiconductor power switch circuit 254 in a way that generates the excitation current needed for complex impedance measurements by CSCs 206. In some examples, semiconductor power switch circuit 254 may comprise a BDS for system 200, and hence semiconductor power switch circuit 254 may also be controlled by driver circuit 204 or another circuit to disconnect battery stack 202 from motor 22 and DC link capacitor 20 in response to a fault, a command, or any other error or event that may demand a safety disconnect.

Driver circuit 204 may comprise a circuit configured to control semiconductor power switch circuit 254. For example, driver circuit may comprise a DC/DC power converter, a voltage regulator, or another voltage control circuit configured to define gate voltages sufficient to control the ON/OFF state of semiconductor power switch circuit 254. Driver circuit 204 may be connected to a supply and may receive pulse modulation (PM) control signals (e.g., pulse width modulation-PWM-control signals) from a processor (such as host controller 280 or another processor). In some cases, the processor that sends the control signal may be galvanically isolated from driver circuit 204. Driver circuit 204 may be configured to define PM drive signals (e.g., PWM drive signals) based on the PM control signals. The PM drive signals may generally conform to the PM control signals. However, the PM drive signals may be level shifted, amplified, adjusted, or otherwise converted (relative to the PM control signals) so as to define the necessary voltage levels needed for transistor gate control of semiconductor power switch circuit 254.

Thus, by creating PM drive signals based on PM control signals, driver circuit 204 may be configured to control an ON/OFF state of semiconductor power switch circuit 254. Semiconductor power switch circuit 254 is configured to connect a plurality of battery cells within battery stack 202 to DC link capacitor 20 associated with electric motor 22. More specifically, driver circuit 204 may be configured to control semiconductor power switch circuit 204 to cause the plurality of battery cells of battery stack 202 to charge DC link capacitor 20. In addition, driver circuit 204 may be configured to control semiconductor power switch circuit 204 to generate and deliver an excitation current from the plurality of battery cells of battery stack 202, wherein the excitation current is defined for a complex battery impedance measurement operation, e.g., by one or more of CSCs 206.

The current delivered to DC link capacitor 20 through semiconductor power switch 254 may define a high-frequency periodic signal (i.e., an alternating signal), and the alternating nature of the signal can allow the signal to pass through DC link capacitor 20 and back to battery stack 202 as an excitation signal for the battery cells in battery stack 202. In this way, the excitation current can be defined and used for complex cell impedance measurement operations to be performed by one or more CSCs 206 on each of the plurality of battery cells of battery stack 202. The excitation current, for example, may comprise a periodic signal that includes at least 3 periods, and in some examples, the periodic signal may include between 5 and 10 periods inclusive. Driver circuit 204 may be is configured to control the ON/OFF state of the semiconductor power switch circuit according to PM signals, wherein the PM signals are configured to define the excitation current. For example, the PM signals may operate to turn semiconductor power switch circuit ON and OFF more quickly than would normally be the case for DC capacitor charging, which creates the periodic nature of the current profile, needed for complex impedance measurements. In this case, the current through semiconductor power switch 254 may simultaneously charge DC link capacitor 20, and define the excitation current delivered from the plurality of battery cells (e.g., from HV+) through DC link capacitor 20 and back to the plurality of battery cells (e.g., at HV−).

For steady state system operation, driver circuit 204 may be configured to control semiconductor power switch circuit to connect the plurality of battery cells to the electric motor in the presence of a charged DC link capacitor such that the plurality of battery cells deliver power to the electric motor. The charging of DC link capacitor 20 may be performed in a start-up routine, e.g., at each start-up of an electric vehicle. For example, driver circuit 204 may be configured to perform a start-up routine associated with electric motor 22, wherein the start-up routine comprises controlling semiconductor power switch circuit 254 to cause the plurality of battery cells of battery stack 202 to charge DC link capacitor 20, and controlling semiconductor power switch circuit 254 to generate and deliver the excitation current from plurality of battery cells of battery stack (e.g., from HV+) back to the plurality of battery cells (e.g., at HV−). In some cases, a low side disconnect switch 256 is also included, and typically closed unless a disconnect event is needed. Low side disconnect switch 256 may comprise a mechanical relay or another semiconductor power switch similar or identical to semiconductor power switch 254 of FIG. 2 or BDS 14 of FIG. 1.

A separate discharge circuit (not shown in FIG. 2) may be configured to perform a shut-down routine associated with electric motor 22, e.g., at each shut down of a vehicle. The shut-down routine may comprise discharging DC link capacitor 20 to promote safety during the shutdown state.

Electrochemical impedance spectroscopy (EIS) techniques may be performed by CSC circuits 206, and for this an excitation current at frequencies above 20 Hz may be desirable. Moreover, at least three periods of oscillation in the excitation current, such as 5-10 periods may be useful for effective EIS techniques.

Figure 3:
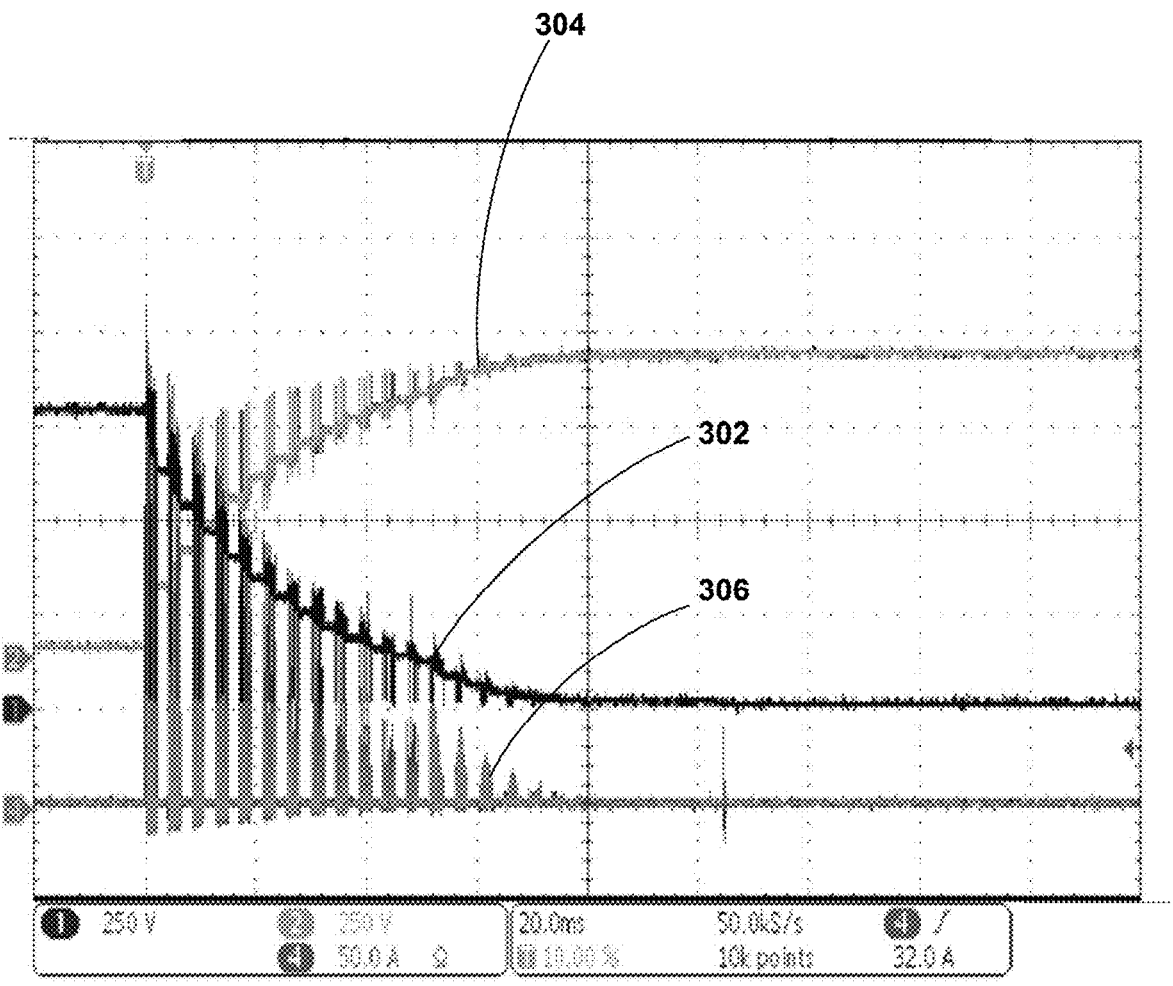
FIG. 3 is a graph showing pulse modulation signals and resulting current through a power switch.

FIG. 3 is a graph showing pulse modulation signals and resulting current for burst charging a DC link capacitor through a semiconductor power switch circuit (such as a BDS). In this example, signal 302 represents a voltage across the semiconductor power switch, signal 304 represents the output voltage, signal 306 represents current through the semiconductor power switch. Such burst charging may typically perform a burst of approx. 50 pulses, then measure the voltage at the output. If the voltage at the output is below the target voltage, the system may perform a another burst after a deadtime delay. Pre-charging a DC link capacitor may be completed in approximately 80 ms. However, this depends on the line inductances and can be parameterized or adjusted, as required.

Figure 4:
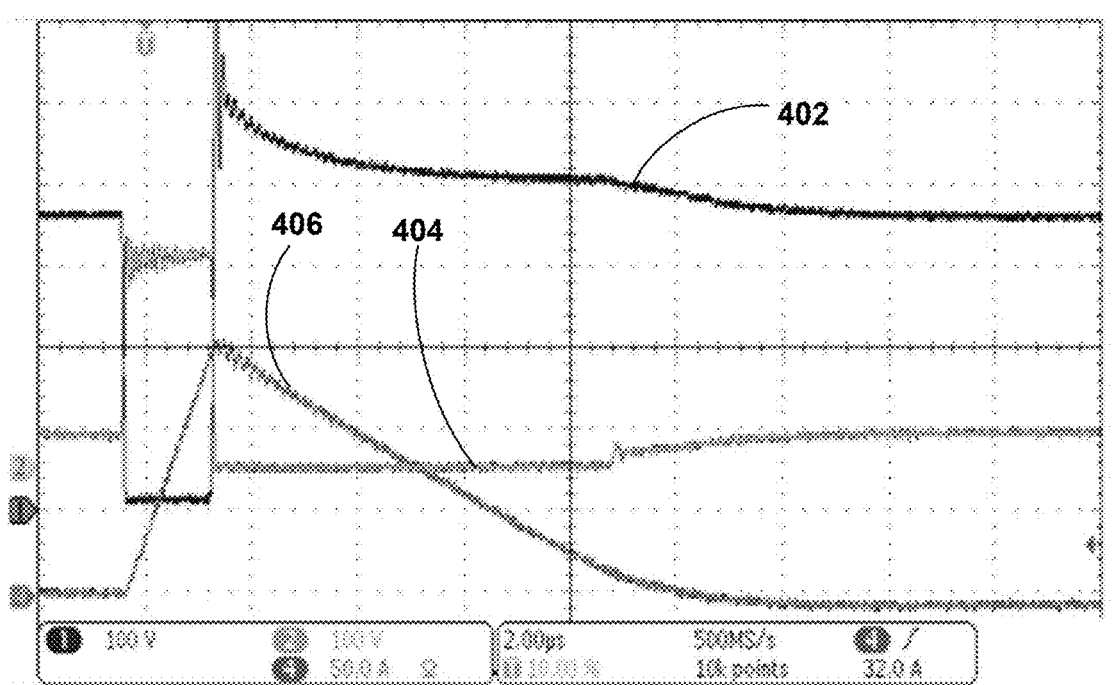
FIG. 4 is graphical close-up view of a portion of the graph of FIG. 3.

FIG. 4 is graphical close-up view of a portion of the graph of FIG. 3. Signal 402 is a close-up view of signal 302. Signal 404 is a close-up view of signal 304, and signal 406 is a close-up view of signal 306. In this example, Switch On time may be greater than 0.5 us, the period may be greater than 1 us, and rise time may be approximately 80 ns.

According to the disclosure, the pre-charging of the DC link capacitor may also be used for generation of an excitation signal for EIS measurements performed by CSC circuits 206. In this case, driver circuit 204 may include a current control loop for generating dedicated PWM Pulses. For a continuous wave EIS, the following quantities may be desirable:

Expected Frequencies: 100 HZ up to ⅔ KHz.

Amplitude: several A up to 20 A, depends on the accuracy of the Cell Voltage ADC.

At least 10 periods

For time domain measurements, the following quantities may be desirable:

Current Pulse: dis-charge Pulse

Pulse Width: up to some seconds

Expected Frequency: mHz up to 50 Hz

Amplitude: several A up to 20 A

In some examples, in using the pre-charging of the DC link capacitor for also the generation an excitation signal for EIS measurement, the following quantities may be desirable:

Expected Frequencies: 100 mHz up to ⅔ KHz.

Amplitude: several A up to 20 A, or even up to 200 A or anything sufficiently below an overcurrent threshold, depends on the accuracy of the Cell Voltage analog-to-digital converter (ADC).

5 to 10 periods of excitation.

Current feedback loop in the driver circuit for controlling the PWM signal

Figure 5:
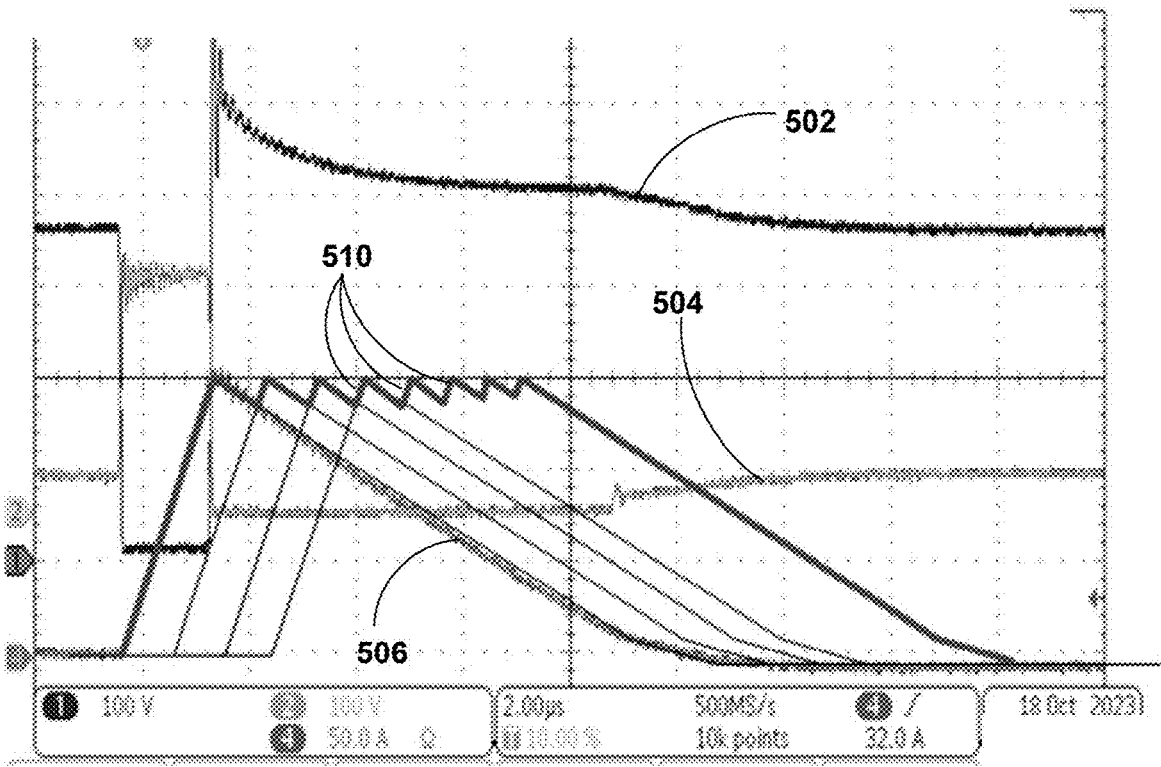
FIG. 5 is a graphical view similar to FIG. 4, further showing how multiple current pulses similar to that shown in FIG. 4 can result in the creation of a periodic excitation current signal.

Continuous wave electrochemical impedance spectroscopy (CW_EIS): Generating Sin/Rect periodic signals Time domain measurement (TDM): generating current pulses FIG. 5 is a graphical view similar to FIG. 4, further showing how multiple current pulses similar to that shown in FIG. 4 can result in the creation of a periodic excitation current signal. In this case, signals 502 and 504 may be repeated quickly (not illustrated) for several cycles (periods) without allowing signal 506 to dissipate. The quick repetition of signals 502 and 504 can result in the creation of a periodic (and generally constant) current signal 510 that both effective for charging the DC link capacitor and also effective as an excitation current signal for EIS measurements. A 50% duty cycle or another duty cycle may be used. If a 25% duty cycle were used, then the frequency range would double, relative to using a 50% duty cycle. Accordingly, duty cycle control by driver circuit 204 could be used to tune the frequency of the excitation signal.

Figure 6:
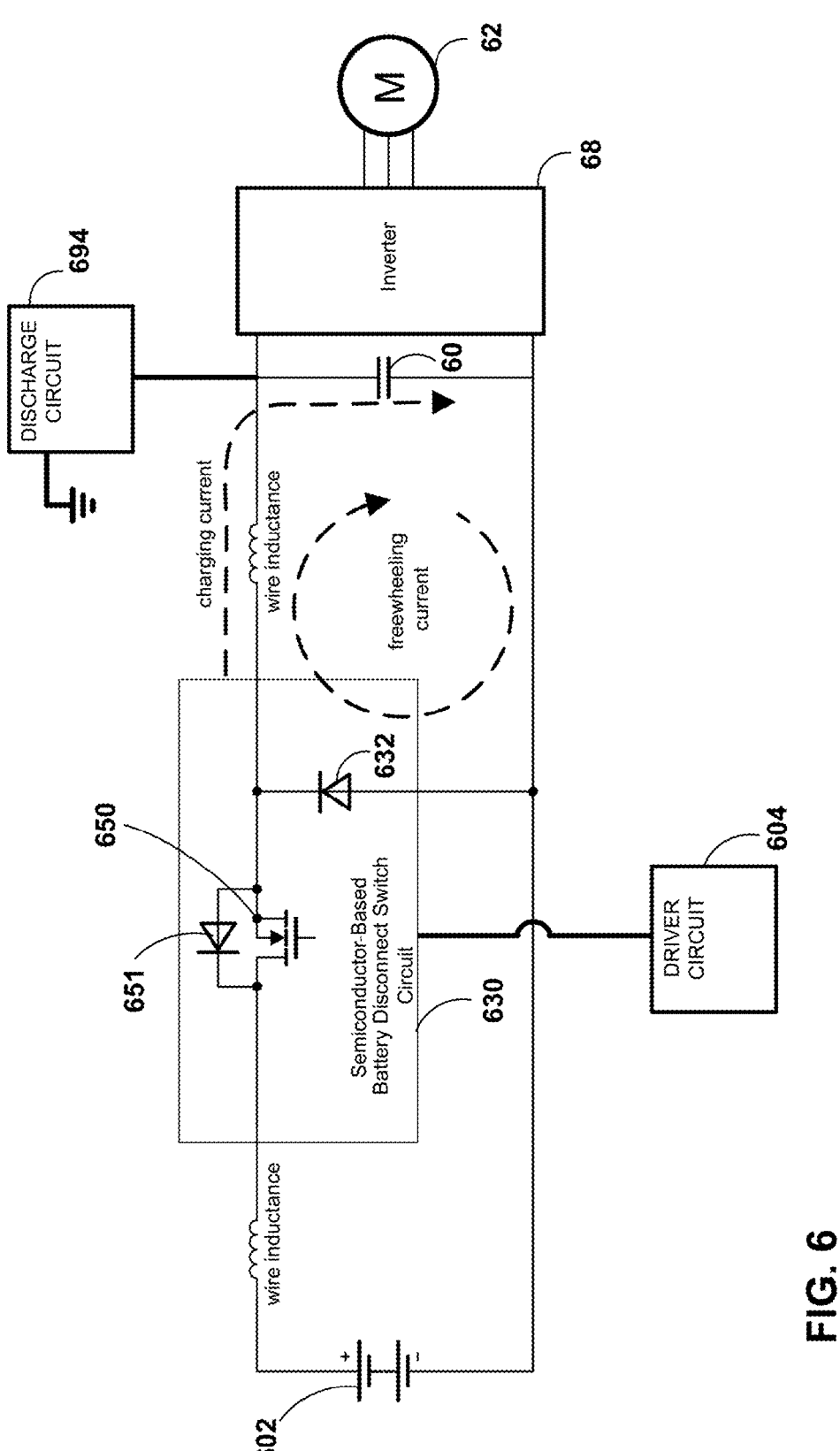
FIG. 6 is another system diagram showing another example system for charging a DC link capacitor associated with an electric motor consistent with this disclosure.

FIG. 6 is another system diagram showing another example system for charging a DC link capacitor associated with an electric motor consistent with this disclosure. The system shown in FIG. 6 comprises a semiconductor-based battery disconnect switch (BDS) circuit 630, which includes a semiconductor-based MOSFET 650, which includes body diode 651. In addition, in the example system shown in FIG. 6, semiconductor-based BDS circuit 630 also includes a diode 632 arranged to create a freewheeling current path over DC link capacitor 60, which is connected to the output of semiconductor-based BDS circuit 632.

According to this disclosure, a driver circuit 604 may be configured to control semiconductor-based MOSFET 650 of semiconductor-based BDS circuit 630 in a way that generates the excitation current needed for complex impedance measurements by CSCs (not shown in FIG. 6) that monitor the cells of battery 602. To function as a BDS switch, semiconductor-based BDS circuit 630 may be controlled by driver circuit 604 or another circuit in order to cause disconnection between battery 602 relative to motor 62 and DC link capacitor 60 in response to a fault, a command, or any other error or event that may demand a safety disconnect.

As examples, driver circuit 604 may comprise a DC/DC power converter, a voltage regulator, or another voltage control circuit configured to define gate voltages sufficient to control the ON/OFF state of semiconductor-based MOSFET 650. Driver circuit 604 may be connected to a supply and may receive PM control signals (e.g., PWM control signals) from a processor. Driver circuit 604 may be configured to define PM drive signals (e.g., PWM drive signals) based on the PM control signals. The PM drive signals may define the necessary voltage levels needed for transistor gate control of semiconductor-based MOSFET 650. In still other examples, a bipolar gate transistor (BGT), or another type of power transistor may be used instead of the MOSFET 650 shown in FIG. 6.

Driver circuit 604 may be configured to control an ON/OFF state of semiconductor-based MOSFET 650. Semiconductor-based BDS circuit 630 is configured to connect a plurality of battery cells of battery 602 to DC link capacitor 60 associated with electric motor 62. More specifically, driver circuit 604 may be configured to control semiconductor-based MOSFET 650 to cause the plurality of battery cells of battery 602 to charge DC link capacitor 60. In addition, driver circuit 604 may be configured to control semiconductor-based MOSFET 650 to generate and deliver an excitation current from the plurality of battery cells of battery 602, wherein the excitation current is defined for a complex battery impedance measurement operation, e.g., by one or more of CSCs.

The current delivered to DC link capacitor 60 through semiconductor-based MOSFET 650 may define a high-frequency periodic signal (i.e., an alternating signal), and the alternating nature of the signal can allow the signal to pass through DC link capacitor 60 and back to battery 602 as an excitation signal for the battery cells in battery 602. In this way, the excitation current can be defined and used for complex cell impedance measurement operations to be performed by one or more CSCs on each of the plurality of battery cells of battery 602. The excitation current, for example, may comprise a periodic signal that includes at least 3 periods, and in some examples, the periodic signal may include between 5 and 10 periods inclusive. Driver circuit 204 may be is configured to control the ON/OFF state of the semiconductor power switch circuit according to PM signals, wherein the PM signals are configured to define the excitation current. For example, the PM signals may operate to turn semiconductor power switch circuit ON and OFF more quickly than would normally be the case for DC capacitor charging, which creates the periodic nature of the current profile, needed for complex impedance measurements. In this case, the current through semiconductor-based MOSFET 650 may simultaneously charge DC link capacitor 60, and define the excitation current delivered from the plurality of battery cells of battery 602 through DC link capacitor 60 and back to the plurality of battery cells.

For steady state system operation, driver circuit 604 may be configured to control semiconductor power switch circuit to connect the plurality of battery cells to the electric motor in the presence of a charged DC link capacitor 60 such that the plurality of battery cells of battery 602 deliver power to electric motor 22. The charging of DC link capacitor 60 may be performed in a start-up routine, e.g., at each start-up of an electric vehicle. For example, driver circuit 604 may be configured to perform a start-up routine associate with electric motor 62, wherein the start-up routine comprises controlling semiconductor-based MOSFET 650 to cause the plurality of battery cells of battery 602 to charge DC link capacitor 60, and controlling semiconductor-based MOSFET 650 to generate and deliver the excitation current from plurality of battery cells of battery 602 back to the plurality of battery cells of battery 602.

At system shut down (e.g., when the electric vehicle is turned off) discharge circuit 694 may be configured to perform a shut-down routine associated with electric motor 62. The shut-down routine may comprise discharging DC link capacitor 60 in order to promote safety during the shutdown state.

Figures 7, 8:
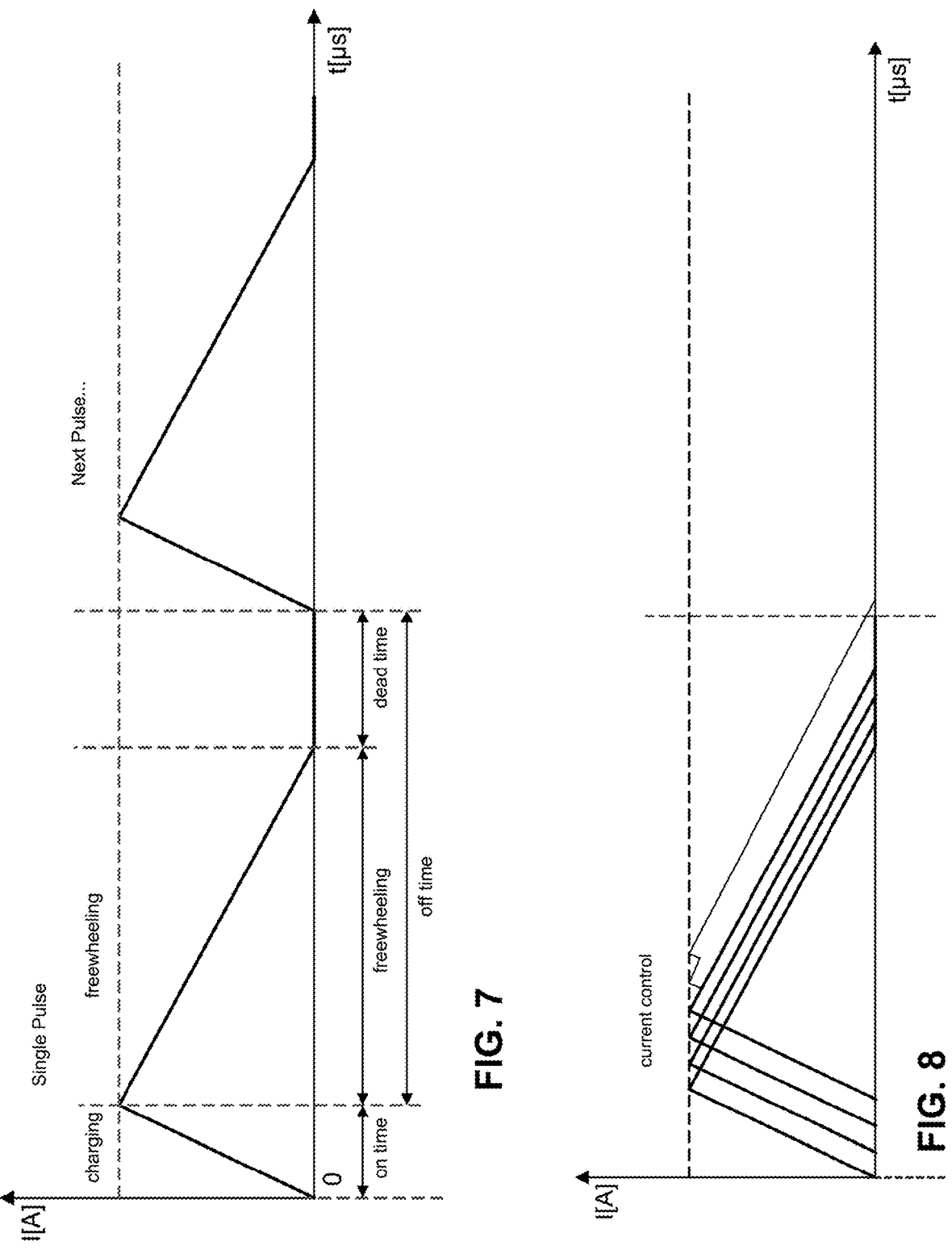
FIG. 7 is a graph showing single pulse charging of a DC link capacitor.
FIG. 8 is a graph showing multiple pulse charging of a DC link capacitor so as to create a periodic signal capable of passing through the DC link capacitor to excite battery cells for an inductance measurement.

FIG. 7 is a graph showing single pulse charging of a DC link capacitor. In this type of operation of semiconductor-based MOSFET 650, an ON time is followed by an OFF time, wherein the ON time causes charging, and the OFF time includes a free-wheeling state followed by a deadtime state. During the free-wheeling state, free-wheeling current flows over the wires as illustrated "freewheeling" in FIG. 6. After all current has dissipated in the freewheeling state, a "dead time" delay is performed prior to the next charging phase. The cycle generally repeats until the desired charging is achieved on DC link capacitor 60.

FIG. 8 is a graph showing multiple pulse charging of a DC link capacitor so as to create a periodic signal capable of passing through the DC link capacitor to excite battery cells for an inductance measurement. In contrast to the charging shown in FIG. 7, the charging in FIG. 8 achieves a generally constant current in the "current control phase." During the "current control" phase semiconductor-based MOSFET 650 is controlled ON and OFF much more quickly than the example of FIG. 7 for controlled current at a defined current level. In particular, the ON and OFF control of semiconductor-based MOSFET 650 causes the peaks and valleys within a narrow current range in the "current control" phase labeled in FIG. 8. This creates a generally steady current with a ripple waveform with small peaks and valleys within a narrowly defined current range. The ON/OFF control is performed much more quickly than the control shown in FIG. 8, and without any deadtime and without allowing the free-wheeling current to dissipate fully. Rather, the ON-OFF control of semiconductor-based MOSFET 650 shown in FIG. 8 is performed quickly to cause the peaks and valleys in the "current control" phase labeled in FIG. 8 at a generally steady current level that does not dissipate to zero. In this case, approximately steady current flows into DC link capacitor 60 in quick current pulses, with an oscillating frequency of the peaks and valleys shown in the "current control" phase labeled in FIG. 8 that can be defined or tuned as a excitation signal based on the ON-OFF control of semiconductor-based MOSFET 650. Consistent with FIG. 8, the excitation signal may be defined during the "current control" phase by controlling semiconductor-based MOS-FET 650 to cause successive phases of charging-freewheeling-charging-freewheeling-charging-freewheeling, and so forth, without any intentional deadtime. Upon creating a desirable excitation signal for the battery cells of battery 602, EIS techniques may be performed on the battery cells of battery 602, e.g., by CSC circuits. The inductance measurements by the CSC circuits, then may be used by a system-level processor for battery cell balancing, estimation of state of health/safety (SOH/SOS), identifying issues or problems, predictive system maintenance, or other reasons.

In some examples, a circuit package may include both a semiconductor power switch circuit and the driver circuit that controls the semiconductor power switch, e.g. as an integrated BDS/driver capable of excitation charging. In other examples, the semiconductor power switch circuit and the driver circuit may be positioned on different printed circuit boards or located in different circuit packages.

Figure 9:
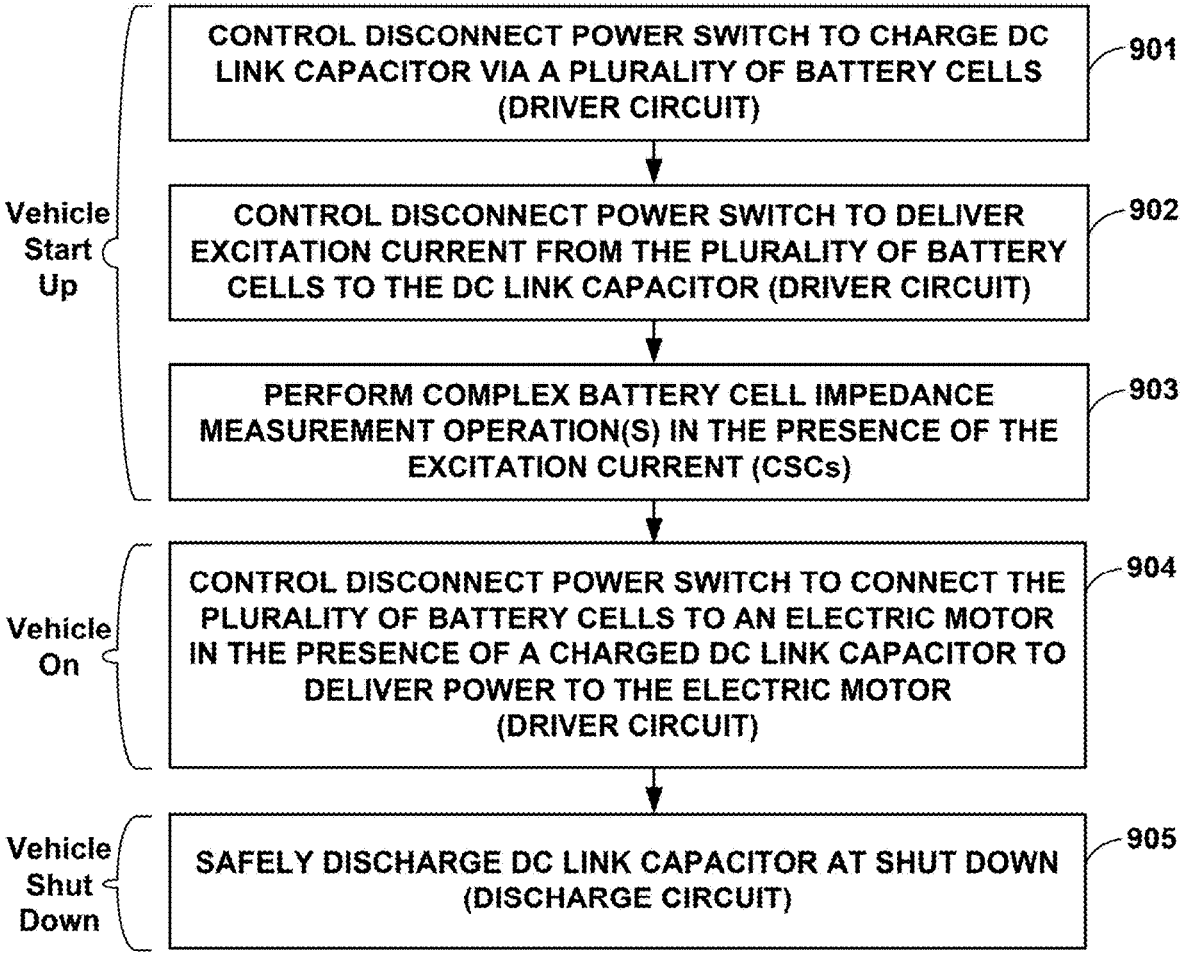
FIG. 9 is a flow diagram consistent with techniques of this disclosure.

FIG. 9 is a flow diagram consistent with techniques of this disclosure. The process of FIG. 9 may be performed by circuits and systems described herein. As shown in FIG. 9, a driver circuit may control a disconnect power switch to charge a DC link capacitor via energy from a plurality of battery cells (901), and the driver may also control the disconnect power switch to deliver excitation current from the plurality of battery cells to the DC link capacitor (902). This excitation current may pass through the DC link capacitor as an oscillating (high frequency) signal so as to excite the battery cells. One or more CSCs may then perform complex battery cell impedance measurement operations in the presence of the excitation current. Steps 901-903 may be performed as part of a vehicle start up process, e.g., performed each time the vehicle is started.

When the vehicle is in an ON state (e.g., normal operation), a driver circuit may control the disconnect power switch to connect the plurality of battery cells to an electric motor in a presence of a charged DC link capacitor (e.g., positioned in parallel with the electric motor), in order to deliver power to the electric motor. The driver circuit that performs steps 901, 902 may be the same driver circuit that performs step 904, or in some cases, a different driver circuit may be used for step 904. When the vehicle shut down (e.g., each time the vehicle is turned OFF), a discharge circuit may be configured to safely discharge the DC link capacitor.

One or more aspects of the techniques described in this disclosure may be implemented, at least in part, in integrated circuitry, discrete circuitry, hardware, software, firmware or any combination thereof. For example, various aspects of the described techniques may be implemented within processors, which may include one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, in which case those aspects of the techniques described in this disclosure may also be embodied or encoded in a computer-readable medium, such as a computer-readable storage medium, containing instructions. Instructions embedded or encoded in a computer-readable storage medium may cause a processor, to perform the method, e.g., when the instructions are executed. The instructions, in this example, may be stored in a memory, which may comprise random access memory (RAM), read only memory (ROM), programmable read only memory (PROM), erasable programmable read only memory (EPROM), electronically erasable programmable read only memory (EEPROM), flash memory, or other computer readable media.

The following clauses may illustrate one or more aspects of the disclosure.

Clause 1—A driver circuit configured to control an ON/OFF state of a semiconductor power switch circuit, wherein the semiconductor power switch circuit is configured to connect a plurality of battery cells to a DC link capacitor associated with an electric motor, wherein the driver circuit is configured to: control the semiconductor power switch circuit to cause the plurality of battery cells to charge the DC link capacitor; and control the semiconductor power switch circuit to generate and deliver an excitation current from the plurality of battery cells, wherein the excitation current is defined for a complex battery cell impedance measurement operation.

Clause 2—The driver circuit of clause 1, wherein the driver circuit is further configured to control the semiconductor power switch circuit to connect the plurality of battery cells to the electric motor in a presence of a charged DC link capacitor such that the plurality of battery cells deliver power to the electric motor.

Clause 3—The driver circuit of clause 1 or 2, wherein the driver circuit is configured to perform a start-up routine associated with the electric motor and wherein a discharge circuit is configured to perform a shut-down routine associated with the electric motor, wherein the start-up routine comprises: controlling the semiconductor power switch circuit to cause the plurality of battery cells to charge the DC link capacitor; and controlling the semiconductor power switch circuit to generate and deliver the excitation current from the plurality of battery cells to the plurality of battery cells, and wherein the shut-down routine comprises: discharging the DC link capacitor via the discharge circuit.

Clause 4—The driver circuit of clause 3, wherein the driver circuit is associated with an electric vehicle and wherein the start-up routine is performed at each start-up of the electric vehicle and wherein the shut-down routine is performed at each shut-down of the electric vehicle.

Clause 5—The driver circuit of any of clauses 1-4, wherein the excitation current is defined for the complex battery cell impedance measurement operation to be performed by one or more CSCs on each of the plurality of battery cells.

Clause 6—The driver circuit of any of claims 1-5, wherein the excitation current comprises a periodic signal that includes at least 3 periods.

Clause 7—The driver circuit of claim 6, wherein the periodic signal includes between 5 and 10 periods inclusive.

Clause 8—The driver circuit of any of clauses 1-7, wherein the driver circuit is configured to control the ON/OFF state of the semiconductor power switch circuit according to PM signals, wherein the PM signals are configured to define the excitation current.

Clause 9—The driver circuit of any of clauses 1-8, wherein a current through the semiconductor power switch circuit simultaneously: charges the DC link capacitor; and defines the excitation current delivered from the plurality of battery cells to the plurality of battery cells.

Clause 10—A method comprising: controlling a semiconductor power switch circuit to connect a plurality of battery cells to a DC link capacitor associated with an electric motor, wherein controlling the semiconductor power switch circuit includes: controlling the semiconductor power switch circuit to cause the plurality of battery cells to charge the DC link capacitor; and controlling the semiconductor power switch circuit to generate and deliver an excitation current from the plurality of battery cells to the plurality of battery cells, wherein the excitation current is defined for a complex battery cell impedance measurement operation.

Clause 11—The method of clause 10, further comprising: controlling the semiconductor power switch circuit to connect the plurality of battery cells to the electric motor in a presence of a charged DC link capacitor such that the plurality of battery cells deliver power to the electric motor.

Clause 12—The method of clause 10 or 11, wherein the method includes: performing a start-up routine; and performing a shut-down routine, wherein the start-up routine comprises: controlling the semiconductor power switch circuit to cause the plurality of battery cells to charge the DC link capacitor; and controlling the semiconductor power switch circuit to generate and deliver the excitation current from the plurality of battery cells to the plurality of battery cells; and wherein the shut-down routine comprises: discharging the DC link capacitor.

Clause 13—The method of clause 12, wherein the method is associated with an electric vehicle and wherein the start-up routine is performed at each start-up of the electric vehicle and wherein the shut-down routine is performed at each shut-down of the electric vehicle.

Clause 14—The method of any of clauses 10-14, wherein the excitation current is defined for the complex battery cell impedance measurement operation by one or more cell sensor circuits (CSCs) on each of the plurality of battery cells.

Clause 15—The method of any of clauses 10-15, wherein the excitation current comprises a periodic signal that includes at least 3 periods.

Clause 16—The method of clause 15, wherein the periodic signal includes between 5 and 10 periods inclusive.

Clause 17—The method of any of clauses 10-16, further comprising controlling an ON/OFF state of the semiconductor power switch circuit according to PM signals, wherein the PM signals are configured to define the excitation current.

Clause 18—The method any of clauses 10-17, wherein current through the semiconductor power switch circuit simultaneously: charges the DC link capacitor; and defines the excitation current delivered to from the plurality of battery cells to the plurality of battery cells.

Clause 19—A system comprising: a semiconductor power switch circuit configured to connect a plurality of battery cells to a DC link capacitor associated with an electric motor; and a driver circuit configured to control an ON/OFF state of the semiconductor power switch circuit, wherein the driver circuit is configured to: control the semiconductor power switch circuit to cause the plurality of battery cells to charge the DC link capacitor; and control the semiconductor power switch circuit to generate and deliver an excitation current from the plurality of battery cells to the plurality of battery cells, wherein the excitation current is defined for a complex battery impedance measurement operation.

Clause 20. The system of clause 19, wherein the semiconductor power switch circuit and the driver circuit are positioned on different printed circuit boards.

Clause 21. The system of clause 19 or 20, further comprising: the plurality of battery cells; the electric motor; and the DC link capacitor associated with the electric motor and arranged in parallel with the electric motor.

Various aspects and examples have been described in this disclosure. These and other aspects and examples are within the scope of the following claims.

The invention claimed is:

1. A driver circuit configured to control an ON/OFF state of a semiconductor power switch circuit, wherein the semiconductor power switch circuit is configured to connect a plurality of battery cells to a DC link capacitor associated with an electric motor, wherein the driver circuit is configured to:

control the semiconductor power switch circuit to cause the plurality of battery cells to charge the DC link capacitor, wherein the DC link capacitor is positioned on an opposite side of the semiconductor power switch circuit relative to the plurality of battery cells and the DC link capacitor is positioned in parallel with the electric motor; and control the semiconductor power switch circuit to generate and deliver an excitation current from the plurality of battery cells, wherein the excitation current is defined for a complex battery cell impedance measurement operation and wherein the excitation current comprises a periodic signal that passes from the semiconductor power switch circuit, through the DC link capacitor, and back to the plurality of battery cells.

2. The driver circuit of claim 1, wherein the driver circuit is further configured to control the semiconductor power switch circuit to connect the plurality of battery cells to the electric motor in a presence of a charged DC link capacitor such that the plurality of battery cells deliver power to the electric motor.

3. The driver circuit of claim 1, wherein the driver circuit is configured to perform a start-up routine associated with the electric motor and wherein a discharge circuit is configured to perform a shut-down routine associated with the electric motor, wherein the start-up routine comprises:

controlling the semiconductor power switch circuit to cause the plurality of battery cells to charge the DC link capacitor; and controlling the semiconductor power switch circuit to generate and deliver the excitation current from the plurality of battery cells to the plurality of battery cells; and wherein the shut-down routine comprises:

discharging the DC link capacitor via the discharge circuit.

4. The driver circuit of claim 3, wherein the driver circuit is associated with an electric vehicle and wherein the start-up routine is performed at each start-up of the electric vehicle and wherein the shut-down routine is performed at each shut-down of the electric vehicle.

5. The driver circuit of claim 1, wherein the excitation current is defined for the complex battery cell impedance measurement operation to be performed by one or more cell sensor circuits (CSCs) on each of the plurality of battery cells.

6. The driver circuit of claim 5, wherein the excitation current includes at least 3 periods.

7. The driver circuit of claim 6, wherein the periodic signal includes between 5 and 10 periods inclusive.

8. The driver circuit of claim 1, wherein the driver circuit is configured to control the ON/OFF state of the semiconductor power switch circuit according to pulse modulation (PM) signals, wherein the PM signals are configured to define the excitation current.

9. The driver circuit of claim 1, wherein a current through the semiconductor power switch circuit simultaneously:

charges the DC link capacitor; and defines the excitation current delivered from the plurality of battery cells to the plurality of battery cells.

10. A method comprising:

controlling a semiconductor power switch circuit to connect a plurality of battery cells to a DC link capacitor associated with an electric motor, wherein controlling the semiconductor power switch circuit includes:

controlling the semiconductor power switch circuit to cause the plurality of battery cells to charge the DC link capacitor, wherein the DC link capacitor is positioned on an opposite side of the semiconductor power switch circuit relative to the plurality of battery cells and the DC link capacitor is positioned in parallel with the electric motor; and controlling the semiconductor power switch circuit to generate and deliver an excitation current from the plurality of battery cells to the plurality of battery cells, wherein the excitation current is defined for a complex battery cell impedance measurement operation and wherein the excitation current comprises a periodic signal that passes from the semiconductor power switch circuit, through the DC link capacitor, and back to the plurality of battery cells.

11. The method of claim 10, further comprising:

controlling the semiconductor power switch circuit to connect the plurality of battery cells to the electric motor in a presence of a charged DC link capacitor such that the plurality of battery cells deliver power to the electric motor.

12. The method of claim 10, wherein the method includes:

performing a start-up routine; and performing a shut-down routine, wherein the start-up routine comprises:

controlling the semiconductor power switch circuit to cause the plurality of battery cells to charge the DC link capacitor; and controlling the semiconductor power switch circuit to generate and deliver the excitation current from the plurality of battery cells to the plurality of battery cells; and wherein the shut-down routine comprises:

discharging the DC link capacitor.

13. The method of claim 12, wherein the method is associated with an electric vehicle and wherein the start-up routine is performed at each start-up of the electric vehicle and wherein the shut-down routine is performed at each shut-down of the electric vehicle.

14. The method of claim 10, wherein the excitation current is defined for the complex battery cell impedance measurement operation by one or more cell sensor circuits (CSCs) on each of the plurality of battery cells.

15. The method of claim 14, wherein the excitation current includes at least 3 periods.

16. The method of claim 15, wherein the periodic signal includes between 5 and 10 periods inclusive.

17. The method of claim 10, further comprising controlling an ON/OFF state of the semiconductor power switch circuit according to pulse modulation (PM) signals, wherein the PM signals are configured to define the excitation current.

18. The method of claim 10, wherein current through the semiconductor power switch circuit simultaneously:

charges the DC link capacitor; and defines the excitation current delivered to from the plurality of battery cells to the plurality of battery cells.

19. A system comprising:

a semiconductor power switch circuit configured to connect a plurality of battery cells to a DC link capacitor associated with an electric motor; and a driver circuit configured to control an ON/OFF state of the semiconductor power switch circuit, wherein the driver circuit is configured to:

control the semiconductor power switch circuit to cause the plurality of battery cells to charge the DC link capacitor, wherein the DC link capacitor is positioned on an opposite side of the semiconductor power switch circuit relative to the plurality of battery cells and the DC link capacitor is positioned in parallel with the electric motor; and control the semiconductor power switch circuit to generate and deliver an excitation current from the plurality of battery cells to the plurality of battery cells, wherein the excitation current is defined for a complex battery impedance measurement operation and wherein the excitation current comprises a periodic signal that passes from the semiconductor power switch circuit, through the DC link capacitor, and back to the plurality of battery cells.

20. The system of claim 19, wherein the semiconductor power switch circuit and the driver circuit are positioned on different printed circuit boards.

21. The system of claim 19, further comprising:

the plurality of battery cells;

the electric motor; and the DC link capacitor associated with the electric motor.

* * * * *